United States Patent [19]

Attenborough

[11] Patent Number: 4,686,488
[45] Date of Patent: Aug. 11, 1987

[54] FRACTIONAL N FREQUENCY SYNTHESIZER WITH MODULATION COMPENSATION

[75] Inventor: Colin Attenborough, Cambridgeshire, England

[73] Assignee: Plessey Overseas Limited, Ilford, England

[21] Appl. No.: 824,805

[22] Filed: Jan. 31, 1986

[30] Foreign Application Priority Data

Feb. 6, 1985 [GB] United Kingdom ............... 8503013

[51] Int. Cl.$^4$ ............................................. H03L 7/06
[52] U.S. Cl. ......................................... 331/2; 331/15; 331/16; 331/25
[58] Field of Search ................... 331/15, 18, 25, 1 A, 331/2, 16; 455/260; 575/81

[56] References Cited

U.S. PATENT DOCUMENTS

3,798,550 3/1974 Takaoka ........................... 455/260 X
4,609,881 9/1986 Wells ............................... 455/260 X Primary Examiner—Eugene R. LaRoche
Assistant Examiner—David Mis
Attorney, Agent, or Firm—Michael F. Oglo; Julian C. Renfro

[57] ABSTRACT

A frequency synthesizer of the fractional N type comprising a primary voltage controlled oscillator for producing an output signal which is afforded to a phase detector via a divider to provide a control signal for the primary voltage controlled oscillator in the presence of a phase difference between a reference signal from a reference source and the signal afforded thereto from the divider, the division ratio of which may be varied in a fractional N mode to vary the frequency of the output signal in frequency steps smaller than the frequency of the reference signal and wherein a ripple signal tending thereby to be produced and causing frequency modulation of the output signal is compensated by a phase modulator, arranged to couple the divider and the phase detector and to receive a drive signal in antiphase to the ripple signal, wherein the synthesizer further comprises a subsidiary phase lock loop arranged to provide an enhanced representation of the ripple signal in dependence upon the signal afforded to the phase detector from the phase modulator, and a digital to analogue converter arranged to provide the drive signal for the phase modulator in dependence upon the enhanced representation of the ripple signal.

7 Claims, 6 Drawing Figures

FRACTIONAL N FREQUENCY SYNTHESIZER WITH MODULATION COMPENSATION

The present invention relates to improvements in synthesisers of the fractional N type and in particular, to improvements for compensating the ripple signal produced in such synthesisers when operating in the fractional N mode.

Frequency synthesisers usually comprise a voltage controlled oscillator (VCO) for providing an output signal and arranged in a phase lock loop. In order to adjust the frequency of the output signal of the synthesiser the output signal of the VCO is fed via a variable divider to a phase detector which provides a control signal to the VCO in the presence of a phase difference between a reference signal from a reference source and the output signal from the divider. The output frequency of such synthesisers can, however, only be varied as a multiple of the reference signal frequency and it is usually desirable to vary the output frequency in relatively small increments. If the reference signal frequency is reduced in order to produce sufficiently small increments the settling time of the synthesiser may be increased to an extent such that it is impractical for many applications. It has, therefore, previously been proposed to include additional circuitry in the synthesiser to enable to operation in the fractional N mode and such synthesisers are generally known as fractional N synthesisers. In a fractional N synthesiser the division ratio N of the variable divider is controlled in multiples of N such that, over a number of cycles of the reference signal, the mean value of the division ratio, termed N mean, is the desired fraction of the division ratio N.

However, as described subsequently, the operation of the synthesiser in the fractional N mode usually gives rise to a ripple signal on the output signal, which, in view of the phase lock loop configuration in the synthesiser, produces frequency modulation of the output signal from the voltage controlled oscillator and hence, the output signal has poor spectral purity.

In order to compensate the ripple signal it has been proposed to include a phase modulator between the variable divider and phase detector of the phase lock loop. The phase modulator is driven with a drive signal in order to provide compensation of the ripple signal. However, accurate compensation of the ripple signal is heavily dependent on the accurate setting of the level of the drive signal to the phase modulator. Previous attempts to use feedback control to correct the level of the drive signal, and thus to provide optimum compensation of the ripple signal, have relied upon the extraction of a ripple rate signal from the control signal for the voltage controlled oscillator. However, as will be shown subsequently, the amplitude of the ripple signal is small compared to the amplitude of the control signal of the VCO and hence, it is difficult to control accurately the level of the drive signal for the phase modulator.

It is an object of the present invention to provide apparatus and a method for enabling the accurate control of the level of the drive signal to the phase modulator such that cancellation of the ripple signal tends to be maximised.

According to the present invention there is provided a frequency synthesiser of the fractional N type comprising a primary voltage controlled oscillator for producing an output signal which is afforded to a phase detector via a primary divider to provide a control signal for the primary voltage controlled oscillator in the presence of a phase difference between a reference signal from a reference source and the signal afforded thereto from the primary divider, the division ratio of which may be varied in a fractional N mode to vary the frequency of the output signal in frequency steps smaller than the frequency of the reference signal and wherein a ripple signal tending thereby to be produced and causing frequency modulation of the output signal is compensated by a phase modulator, arranged to couple the primary divider and the phase detector and to receive a drive signal, wherein the synthesiser further comprises a subsidiary phase lock loop arranged to provide an enhanced representation of the ripple signal in dependence upon the signal afforded to the phase detector from the phase modulator, and a digital to analogue converter arranged to provide the drive signal for the phase modulator in dependence upon the enhanced representation of the ripple signal.

Preferably the subsidiary phase lock loop comprises a subsidiary voltage controlled oscillator having a sensitivity lower than that of the primary voltage controlled oscillator, a subsidiary divider, and a subsidiary phase detector arranged to receive as a reference signal for the subsidiary phase lock loop a signal dependent upon the signal afforded to the phase detector from the phase modulator.

Additionally, the synthesiser may include a sense detecting circuit, responsive to the enhanced representation of the ripple signal, for providing a signal indicative of the sense of any error in the level of the drive signal to the phase modulator.

The synthesiser may also include a voltage generator circuit arranged to provide a signal dependent upon the reciprocal of the mean division ratio of the primary divider, and wherein the digital to analogue converter comprises a multiplying digital to analogue converter arranged to receive a reference signal dependent upon the combination of the signal provided by the voltage generator circuit and the signal provided by the sense detecting circuit and wherein the digital to analogue converter is arranged to provide the drive signal for the phase modulator in dependence upon the reference signal afforded thereto.

Furthermore, there is also provided a method of compensating a ripple signal tending to cause frequency modulation of the output signal in a fractional N type synthesiser of the type having, arranged in a phase lock loop, a phase detector for receiving a signal from a reference source and an output signal from a primary voltage controlled oscillator via a primary divider having a division ratio N which may be varied in a fractional N mode, and a phase modulator, arranged to couple the divider and the phase detector and for compensating the ripple signal in response to a drive signal fed thereto, the method comprising affording a signal to a subsidiary phase lock loop in dependence upon the signal afforded from the phase modulator to the phase detector thereby to provide an enhanced representation of the ripple signal, and providing via a digital to analogue converter the drive signal to the phase modulator in dependence upon the enhanced representation of the ripple signal.

Preferably, the method also comprises determining the sense of any error in the level of the drive signal to the phase modulator.

Advantageously, the sense of any error in the level of the drive signal to the phase modulator is determined by affording the enhanced representation of the ripple signal provided by the subsidiary phase lock loop via a limiter to a first input of an exclusive OR gate and affording a signal dependent upon the output signal from the digital to analogue converter to a further input of the exclusive OR gate thereby to produce a signal at the output of the exclusive OR gate indicative of the sense of the error in the level of the drive signal to the phase modulator.

The digital to analogue converter may be a multiplying digital to analogue converter having a reference signal input and the method further comprises providing a signal dependent upon the mean division ratio of the primary divider, and combining the signal dependent on this division ratio with a signal in dependence upon the enhanced representation of the ripple signal thereby to provide the input signal for the reference signal input of the multiplying digital to analogue converter.

An exemplary embodiment of the present invention will now be described with reference to the accompanying drawings in which like reference numerals have been used to indicate like elements and in which.

Figure 1:
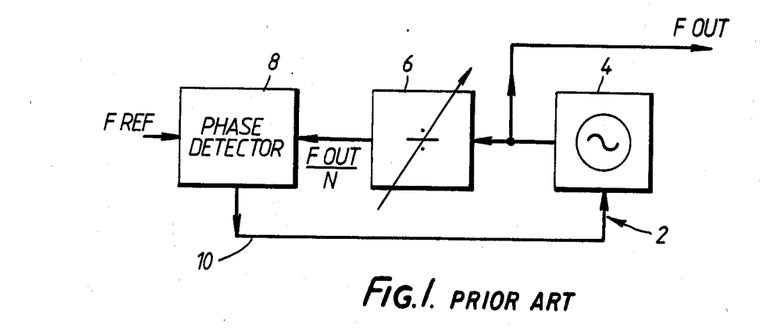
FIG. 1 illustrates a schematic block diagram of a phase lock loop indirect frequency synthesiser.

Referring to FIG. 1, there is shown an indirect frequency synthesiser 2. The synthesiser 2 comprises a phase lock loop having a voltage controlled oscillator (VCO) 4 the output frequency of which $F_{OUT}$ is fed via a variable divider 6, having a division ration N, to a phase detector 8. The phase detector 8 also receives from a reference source (not shown), a reference signal having a reference frequenc $F_{ref}$ and provides a control signal to the oscillator 4 along a loop 10 in the presence of a phase difference between the signals on its two inputs. The sense of the control signal from the phase detector 8 to the oscillator 4 is such that any phase difference between the input signals to the phase detector 8 is reduced to a minimum and hence any difference in the frequencies of these two input signals is reduced to zero. Thus, in a steady state the output frequency of the synthesiser $$F_{OUT} = F_{ref} \times N \qquad (1)$$

It can be seen from expression (1) that the minimum change in output frequency, obtained by incrementing or decrementing the division ratio N by 1, is $F_{ref}$. Thus, if small frequency output steps are required with the synthesiser illustrated in FIG. 1 this can only be achieved by decreasing the reference frequenc $F_{ref}$.

However, as previously stated, with relatively low values of $F_{ref}$ the system becomes slow to respond to demands for changes in the output frequency.

It is evident from expression (1) that small frequency output steps can be achieved with fast response times by providing apparatus which will permit fractions of N to be utilised. Such synthesisers are known as fractional N frequency synthesisers, an embodiment of which is illustrated in FIG. 2.

Figure 2:
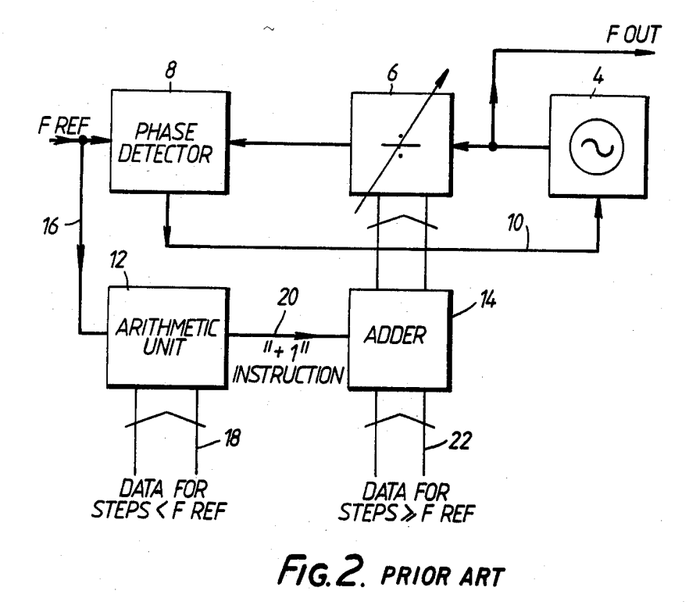
FIG. 2 illustrates a schematic block diagram of a fractional N frequency synthesiser.

In the synthesiser shown in FIG. 2 a relatively high value for the reference frequency $F_{ref}$ is utilised, typically 100 KHz. Small output frequency steps are obtained by selectively controlling the division ratio of the variable divider 6 between N and N plus or minus an integer over a number of cycles of the reference frequency $F_{ref}$. It can be realised that the instructed pattern of, for example, N and N+1 division ratios, will give a mean value of N, termed N mean, such that the output frequency $$F_{OUT} = F_{ref} \times N \text{ mean}$$

In the synthesiser illustrated in FIG. 2 the division ratio of the variable divider 6 is controlled by means of an arithmetic unit 12 and an adder 14. The arithmetic unit 12 is arranged to receive the reference frequency $F_{ref}$ along a line 16 and data indicative of the output frequency steps less than $F_{ref}$ along a data bus 18. The output of the arithmetic unit 12 is connected to the adder 14 by line 20 and the adder 14 is also arranged to receive data indicative of the output frequency steps greater than or equal to $F_{ref}$ along a data bus 22. The desired N/N+1 pattern appropriate to generate the required N mean for a chosen output frequency may be obtained by an arithmetic unit having a BCD adder in combination with D-type flip-flops (not shown) for each decade of decimal N required. For example, to obtain a fractional part of N, such as 0.789, three decades would be required. Such an arrangement may extend for as many decades as required with the carry-out signal of any decade providing the carry in signal of the next significant decade; with the carry out signal of the most significant decade providing the "+1" input instruction to the adder 14 along line 20 from the arithmetic unit 12.

The data word fed to the arithmetic unit 12 is $$\frac{F_{ref}}{\text{Minimum step of } F_{OUT}} \times \frac{\text{Offset from multiple of } F_{ref}}{F_{ref}}$$

The first of these terms defines the capacity of the arithmetic unit 12 and the second term is the fractional offset, denoted by d. For example, consider a system with $F_{ref}$ = 100 KHz, minimum step of 100 Hz with the output frequency $F_{OUT}$ of the synthesiser set to 45.6789 MHz. The value of division ratio N for the variable divider is $$\frac{45.6 \times 10^6}{10^5} = 456.$$

This leaves an offset from the multiple of $F_{ref}$ of 78.9 KHz and hence the data word fed to the arithmetic unit 12 is $$\frac{100 \times 10^3}{100} \times \frac{78.9 \times 10^3}{100 \times 10^3} = 789$$

Therefore, the required capacity of the arithmetic unit 12 is 1000 and three decades will be required.

This type of system has the defect of poor spectral purity of the output signal because the continuously varying division ratio means that pulses from the variable divider 6 arrive at the input to the phase detector 8 at varying times to those arriving at the other input of the phase detector 8 from the reference source (not shown). The output of the phase detector 8 will therefore contain AC components, generally called a ripple signal, at frequencies related the offset of the output frequency $F_{OUT}$ from a whole multiple of the reference frequency $F_{ref}$. The ripple signal is fed around the loop and causes frequency modulation of the oscillator 4; producing poor spectral purity.

Figure 3:
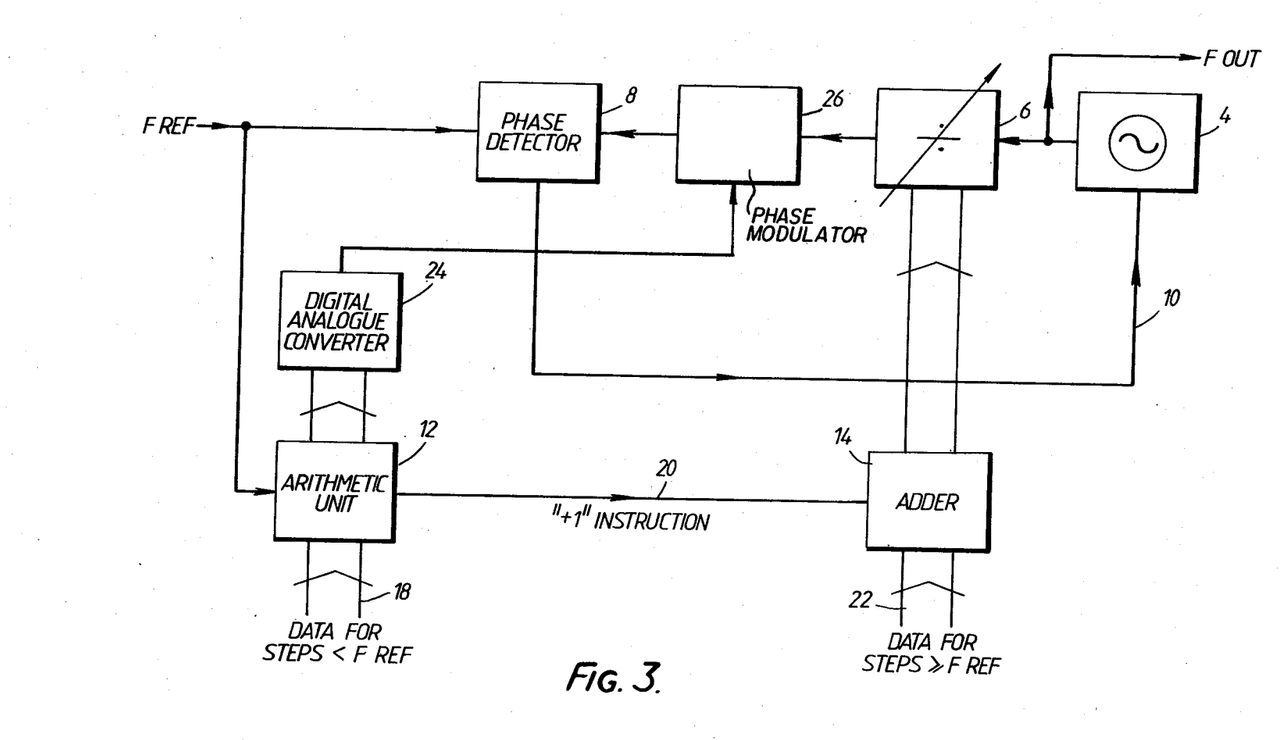
FIG. 3 illustrates a schematic block diagram of a compensated fractional N frequency synthesiser.

FIG. 3 illustrates a compensated fractional N sysnthesiser in which the spectral purity of the output signal $F_{OUT}$ may be improved. The data at the output of the D-type flip flops (not shown) in the arithmetic 12 represent the difference in phase which would exist between the input signals to the phase detector 8 if the output from the oscillator 4 were spectrally pure. Therefore the data at the output of the arithmetic unit 12 may be converted to analogue form by a digital to analogue (D/A) converter 24 and the analogue signal used to control a voltage controlled delay element, such as a phase modulator 26, at either input to the phase detector. If the drive signal to the phase modulator 26 from the D/A converter 24 is at the correct level, the phase detector does not perceive the phase perturbations caused by the ripple signal resulting from the variation in the division ratio of the variable divider 6. Hence, there is no spurious frequency modulation of the output signal from the oscillator 4.

The level of the drive signal to the phase modulator 26 to give the delay required for cancellation can be determined as follows.

Assume that a fractional N synthesiser has an output frequency of $$F_{OUT} = (N+d) F_{ref}$$

where the division ratio N is an integer and the fractional offset $0 \leq d < 1$, and that the output signal $F_{OUT}$ is spectrally pure that is, the edges of the output signal from the variable divider 6 are regularly spaced.

While the division ratio is N, the time between the edges of the output signal from the variable divider is $$T_{var} = \frac{N}{F_{OUT}} = \frac{N}{(N+d) F_{ref}} = \frac{N T_{ref}}{N+d}$$

where $T_{ref}$ is the period of the reference signal.

As this time is not equal to $T_{ref}$, the period between the edges of the pulses in the reference signal and the edges of the pulses in the output of the variable divider 6 will vary. If at some time the edge of a reference signal pulse and the edge of a pulse of the output signal from the variable divider 6 coincide exactly, then the next variable divider output signal edge will precede the next reference signal edge by a time difference DT where $$DT = T_{ref} - T_{var} = T_{ref} - \frac{N T_{ref}}{(N+d)}$$

$$= \frac{d T_{ref}}{(N+d)}$$

This deviation between the reference signal $F_{ref}$ from the reference source and the output signal from the divider 6 increases such that the next respective edges will be separated by twice the amount of the first edges, the next by three times, and so on, until a division ratio of (N+1) is entered into the variable divider 6.

It can be shown that the data at the output terminals of the flip flops used in the arithmetic unit 12 increases in the same pattern as the deviation betwen the inputs to the phase detector 8. The same pattern between these parameters means that the data at the output terminals of the flip flops may be used to compensate the ripple signal in the synthesiser. If the phase detector 8 is not to impose spurious frequency modulation on the output signal $F_{OUT}$, either of its inputs may be delayed by an appropriate amount. However, freedom from spurious frequency modulation is dependent upon the accuracy of the compensation applied and it is difficult to obtain sideband levels below $-40$ dB with respect to the output signal $F_{OUT}$ over a wide temperature range. This is especially true when the output frequency $F_{OUT}$ differs only slightly from an integer multiple of the reference frequenc $F_{ref}$. The loop 10 usually includes a loop filter (not shown) but the low frequency perturbations caused by these conditions are not attenuated by the loop filter and are applied to the oscillator 4, thereby causing frequency modulation of the output signal $F_{OUT}$.

Hence it is desirable to apply some form of feedback to the ripple signal compensation in order to reduce the frequency modulation of the output signal $F_{OUT}$ to a minimum. To achieve this minimum, apparatus has been proposed for detecting the frequency modulation by examining the tuning voltage on the loop 10 to the oscillator 4. However, such apparatus must operate from small AC swings superimposed on large variable DC offset voltages. For example, if the voltage controlled oscillator 4 tunes from 40 to 70 MHz for a tuning voltage swing of 15 volts (a sensitivity of 2 MHz/volt) a peak spurious deviation of 200 Hz on the output signal $F_{OUT}$ is associated with a ripple signal of 100 $\mu$V. If the deviation in the output signal $F_{OUT}$ is to be controlled to lower limits a correspondingly lower ripple signal must be processed, which is difficult in view of the variable DC voltage pedestal necessary to tune the oscillator 4.

Figure 4:
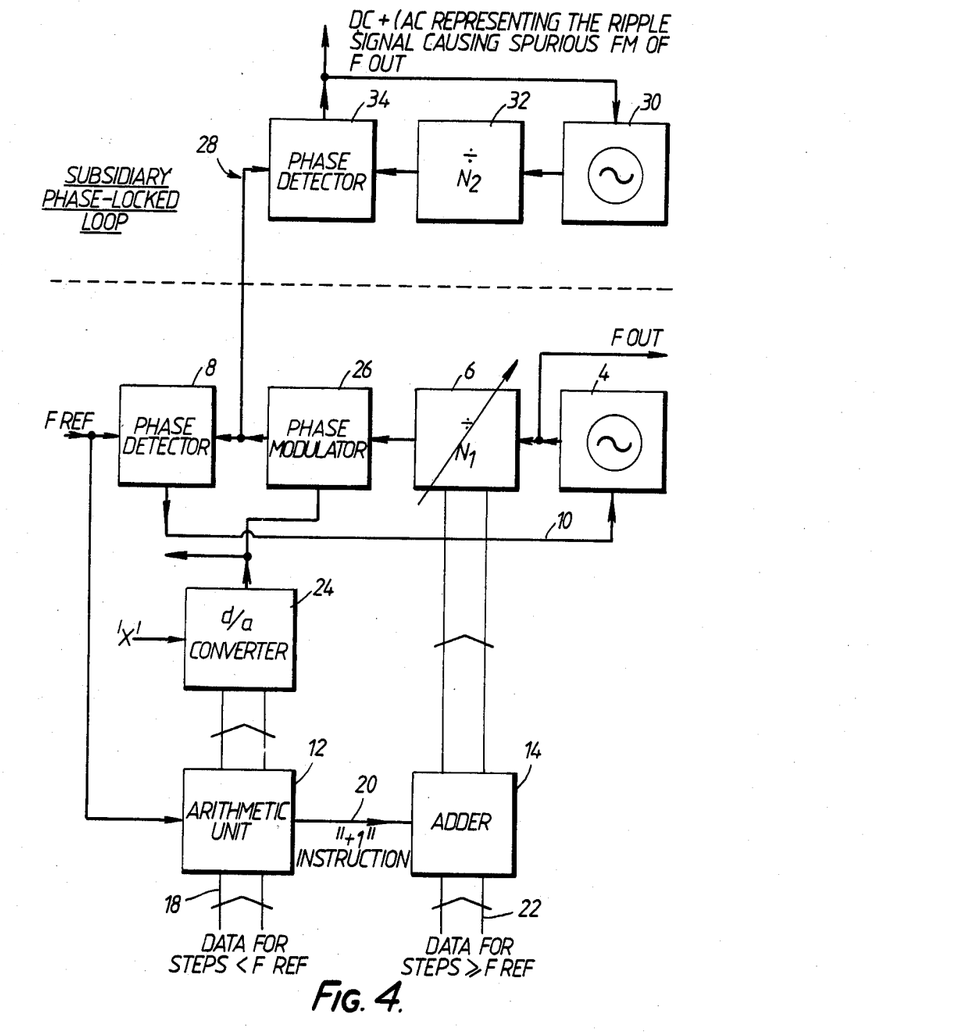
FIG. 4 illustrates a schematic block diagram of a frequency synthesiser incorporating a subsidiary phase lock loop.

Referring to FIG. 4, the synthesiser 2 is provided with the phase modulator 26 located between the variable divider 6 and the phase detector 8. In the synthesiser of FIG. 4, when perfect compensation of the ripple signal is achieved and the system is in lock, the rate of the signal arriving at the phase detector 8 via the phase modulator 26 is constant and equal to the rate of the reference signal $F_{ref}$. A subsidiary phase lock loop 28 is provided which comprises a subsidiary voltage controlled oscillator 30, a subsidiary divider 32 and a subsidiary phase detector 34. The subsidiary phase lock loop (PLL) 28 is arranged such that the output of the phase modulator 26 in the main loop is used to provide the reference signal for the subsidiary phase detector 34.

A spurious FM deviation of DF Hz on the output signal $F_{OUT}$, caused by the ripple signal in the main loop, will cause a deviation of $$DF \times \frac{N_2}{N_1}$$

at the output of the subsidiary phase lock loop 28, where $N_1$ is the division ratio of the variable divider 6 in the main loop and $N_2$ is the division ratio of the subsidiary divider 32.

This deviation in the subsidiary phase lock loop 28 will be associated with a variation of the tuning voltage of the subsidiary voltage controlled oscillator 30. This tuning voltage in the subsidiary phase lock loop 28 will have the same waveform as the ripple signal in the main loop and hence, can be used as a measure of the frequency modulation on the output signal $F_{OUT}$ of the oscillator 4. The subsidiary divider 32 has a fixed division ratio and hence, as the reference frequency for the subsidiary phase lock loop can only vary within a limited range, as determined by the ripple signal, the range of the output frequency of the subsidiary phase lock loop 28 is also limited. Therefore, the subsidiary voltage controlled oscillator 30 can be arranged to have a low sensitivity (Hz/volt) as it does not need a wide tuning range. The lower the sensitivity of the subsidiary voltage controlled oscillator 30, the higher will be its tuning voltage swing as its frequency varies in sympathy with the ripple signal on the output signal $F_{OUT}$ of the oscillator 4. Thus, the subsidiary phase lock loop 28 can provide an enhanced representation of the ripple signal causing frequency modulation of the output signal $F_{OUT}$ in dependence upon the signal afforded to the phase detector 8 from the phase modulator 26.

The subsidiary voltage controlled oscillator 30 may comprise a voltage-tuned crystal oscillator (VCX0) as such oscillators have high stability and sufficiently low sensitivity, typically 100 Hz/volt at an output frequency of 10 MHz.

The advantage provided by the use of such a subsidiary phase lock loop can be seen clearly by way of the following example.

Assume the earlier example quoted of a peak deviation of 200 Hz on the output frequency $F_{OUT}$, which produced a 100 $\mu$V peak signal on the line 10 to the oscillator 4. If the subsidiary voltage controlled oscillator 30 has a tuning frequency of 10 MHz and the oscillator 4 has a tuning frequency of 70 MHz, the 200 Hz variation in the main loop would produce a variation of 200/7 Hz in the subsidiary phase lock loop 28. If the subsidiary voltage controlled oscillator 30 has a sensitivity of 100 Hz/volt, a tuning voltage swing is produced of $$\frac{(200/7)\text{Hz}}{100 \text{ Hz/V}} = \frac{2V}{7}$$

Hence the 100 $\mu$V peak ripple signal is now represented by a signal having a peak of 0.28 V.

The presence of a variation of the tuning voltage of the subsidiary voltage controlled oscillator 30 indicates that the oscillator 4 in the main loop is subject to frequency modulation but it does not indicate the sense in the error in the level of the drive signal to the phase modulator 26, that is whether the level of the drive signal to the phase modulator is causing over or under compensation of the ripple signal.

Figure 5:
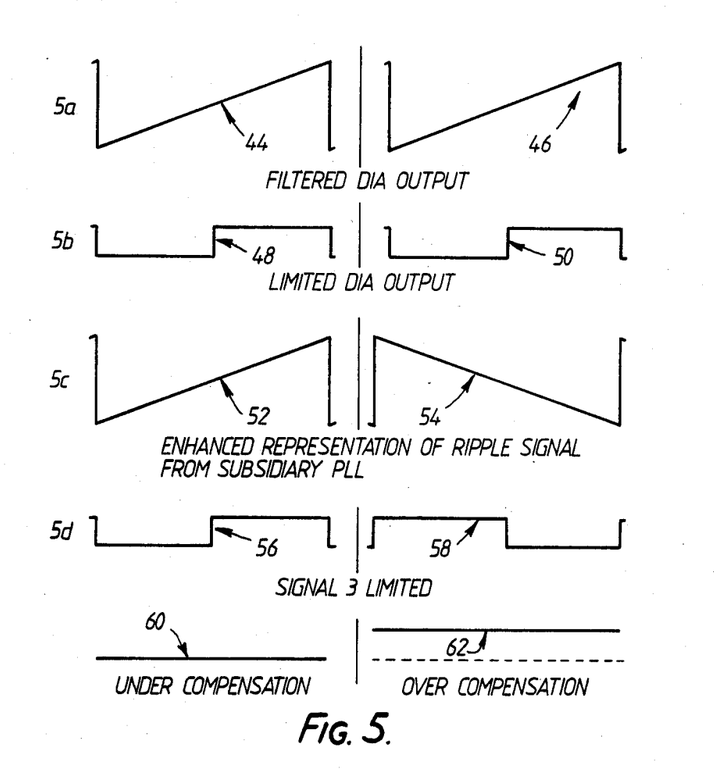
FIG. 5 illustrates a shematic block diagram of a sense detecting circuit for detecting the sense of the ripple signal causing frequency modulation of the output signal of the synthesiser, and the input and output waveforms associated with the sense detecting circuit; and, FIG. 6 illustrates a schematic block diagram of preferred apparatus for providing the compensating drive signal to the phase modulator of the frequency synthesiser shown in FIG. 4.

Information as to the sense of the error in the level of the drive signal can be obtained by the sense detecting circuit shown in FIG. 5. The sense detecting circuit comprises a first limiter 36 arranged to receive the output signal from the D/A converter 24, shown in FIG. 4, via a low pass filter 38, and a further limiter 40 for receiving a signal in dependence upon the enhanced representation of the ripple signal produced by the subsidiary phase lock loop 28. The outputs of the limiters 36 and 40 provide the inputs for an exclusive OR gate 42. The inclusion of the low pass filter 38 may be understood by considering a system with a reference frequency $F_{ref}$ of 100 Khz and the output frequency $F_{OUT}$ set to 45.6251 MHz.

The data word fed to the arithmetic unit 12 is 251 and hence, the required capacity of the arithmetic unit is 1000. The output of the D/A converter 24 contains two main frequency components—a 25 KHz component because the the accumulator in the arithmetic unit 12, having a capacity of 1000, overflows every four cycles of the 100 KHz reference frequency as 4×251 1000; and a 100 Hz component as 1000 cycles of the reference frequency are required to return the arithmetic unit 12 to its initial state. The 25 KHz component is not particularly troublesome to the spectral purity of the output signal $F_{OUT}$ but can interfere with the operation of the limiter 36 and the exclusive OR gate 42 in the sense detecting circuit and is, therefore, removed by means of the filter 38.

The 100 'Hz component will interfere with the spectral purity of the output signal $F_{OUT}$ but falls within the bandwidth of the sense detecting circuit. Hence, its effect on the output signal is compensated in the level of the drive signal afforded to the phase modulator 26.

The operation of the sense detecting circuit is as follows.

The filtered output of the D/A converter 24 is as shown in FIG. 5a. In FIG. 5a waveform 44 shows the filtered D/A output for under compensation of the ripple signal and waveform 46 for over compensation of the ripple signal. The output from the limiter 36 for under and over compensation is, respectively, as shown by waveforms 48 and 50 in FIG. 5b.

The enhanced representation of the ripple signal provided by the subsidiary phase lock loop 28 for under and over compensation of the ripple signal is as shown respectively by waveforms 52 and 54 in FIG. 5c. The limiter 40, in response to the waveforms 52 and 54 produces, respectively, the waveforms 56 and 58 shown in FIG. 5d.

When the waveforms shown in FIGS. 5b and 5d are provided as inputs to the exclusive OR gate 42 it can be seen, from FIG. 5e, that the exclusive OR gate will not provide any output for the output $X_1$ when there is under compensation of the ripple signal, as shown by the zero voltage waveform 60, but will provide an output $X_1$, as shown by waveform 62, when there is over compensation of the ripple signal. Therefore, the output signal $X_1$ of the exclusive OR gate provides a signal which is indicative of the sense of the error in the level of the drive signal to the phase modulator 26.

Conveniently, the drive signal to the phase modulator 26 may be made voltage dependent by the use of a multiplying D/A converter in lieu of the D/A converter 24.

It has been shown earlier that the drive signal to the phase modulator should be proportional to the reciprocal of the mean division ratio of the primary divider 6, that is, proportional to $1/N+d$.

Figure 6:
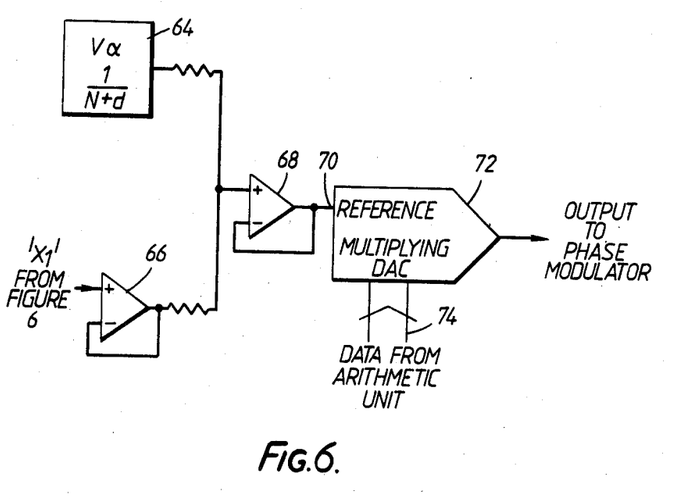

This control of the drive signal to the phase modulator 26 may be achieved by the circuit arrangement shown in FIG. 6. A voltage generator circuit 64 is provided which produces a variable DC signal having a voltage magnitude proportional to 1/N+d. A buffer amplifier 66 is provided for receiving the enhanced representation of the ripple signal produced by the subsidiary phase lock loop 28. These signals are combined and fed via a further buffer amplifier 68 to the reference input terminal 70 of a multiplying D/A converter 72. The multiplying D/A converter 72 also receives data from th arithmetic unit 12 via a data bus 74. The multiplying D/A converter provides an output which is the product of these two inputs and this signal is used as the drive signal for the phase modulator 26. The 1/N+d proportional signal may be generated by known techniques such as providing a variable divider with a subsidiary output signal whose width is a constant number of input pulses. In a locked synthesiser this subsidiary output signal, when low pass filtered, will have a mean value proportional to 1/N+d.

Although the present invention has been described with respect to a particular embodiment, it is to be understood that modifications may be effected within the scope of the invention. For example, both phase lock loops may include a loop filter, and the reference input to the phase detector 34 may not be provided directly from the output from the phase modulator 26 to the phase detector 8 in the main phase lock loop. It is necessary only that the reference input to the subsidiary loop is dependent upon the signal afforded to the phase detector 8.

I claim:

1. A frequency synthesiser of the fractional N type comprising a primary voltage controlled oscillator for producing an output signal which is afforded to a phase detector via a primary divider to provide a control signal for the primary voltage controlled oscillator in the presence of a phase difference between a reference signal from a reference source and the signal afforded thereto from the primary divider, the division ratio of which may be varied in a fractional N mode to vary the frequency of the output signal in frequency steps smaller than the frequency of the reference signal and wherein a ripple signal tending thereby to be produced and causing frequency modulation of the output signal is compensated by a phase modulator, arranged to couple the primary divider and the phase detector and to receive a drive signal wherein the synthesiser further comprises a subsidiary phase lock loop arranged to provide an enhanced representation of the ripple signal in dependence upon the signal afforded to the phase detector from the phase modulator, and a digital to analogue converter arranged to provide the drive signal for the phase modulator in dependence upon the enhanced representation of the ripple signal.

2. A synthesiser according to claim 1 wherein the subsidiary phase lock loop comprises a subsidiary voltage controlled oscillator having a sensitivity lower than that of the primary voltage controlled oscillator, a subsidiary divider, and a subsidiary phase detector arranged to receive as a reference signal for the subsidiary phase lock loop a signal dependent upon the signal afforded to the phase detector from the phase modulator.

3. A synthesiser according to claim 2 wherein the subsidiary voltage controlled oscillator comprises a voltage tuned crystal oscillator.

4. A synthesiser according to one of claims 1, 2 or 3 comprising a sense detecting circuit, responsive to the enhanced respresentation of the ripple signal for providing a signal indicative of the sense of any error in the level of the drive signal to the phase modulator.

5. A synthesiser according to claim 4 comprising a voltage generator circuit arranged to provide a signal dependent upon the mean division ratio of the primary divider, and wherein the digital to analogue converter comprises a multiplying digital to analogue converter arranged to receive a reference signal dependent upon the combination of the signal provided by the voltage generator circuit and the signal provided by the sense detecting circuit and wherein the digital to analogue converter is arranged to provide the drive signal for the phase modulator in dependence upon the reference signal afforded thereto.

6. A synthesiser according to claim 4 wherein the sense detecting circuit comprises a first limiter arranged to receive a signal dependent upon the output signal from the digital to analogue converter and to provide a limited output signal therefrom, a further limiter arranged to receive a signal dependent upon the enhanced representation of the ripple signal provided by the subsidiary phase lock loop and to provide a limited output signal therefrom, and an exclusive OR gate arranged to receive output signals provided by the first and further limiters and to provide therefrom a signal indicative of the sense of the ripple signal.

7. A synthesiser according to claim 6 wherein the sense detecting circuit comprises a low pass filter for filtering the signal dependent upon the output signal from the digital to analogue converter.

* * * * *